(12) United States Patent
Brown et al.

(10) Patent No.: US 7,636,399 B2
(45) Date of Patent: Dec. 22, 2009

(54) ITERATIVE NON-COHERENT CPM DECODER

(75) Inventors: Colin Brown, Ottawa (CA); Philip Vigneron, Kanata (CA)

(73) Assignee: Her Majesty the Queen in Right of Canada as represented by the Minister of Industry, Through the Communications Research Centre Canada, Ottawa (CA)

( * ) Notice: Subject to any disclaimer, the term of this patent is extended or adjusted under 35 U.S.C. 154(b) by 565 days.

(21) Appl. No.: 11/418,151

(22) Filed: May 5, 2006

(65) Prior Publication Data

US 2007/0030926 A1 Feb. 8, 2007

Related U.S. Application Data

(60) Provisional application No. 60/678,226, filed on May 6, 2005.

(51) Int. Cl.
 *H04K 1/10* (2006.01)
(52) U.S. Cl. .................... 375/260; 375/265; 375/341
(58) Field of Classification Search ......... 375/340–341, 375/259, 308, 143, 152; 714/799, 702, 796
See application file for complete search history.

(56) References Cited

U.S. PATENT DOCUMENTS

| | | | | |
|---|---|---|---|---|
| 5,017,883 | A | 5/1991 | Divsalar et al. ............. | 329/304 |
| 6,968,021 | B1* | 11/2005 | White et al. ................ | 375/340 |
| 7,573,962 | B1* | 8/2009 | Tapp et al. .................. | 375/347 |
| 2002/0097818 | A1* | 7/2002 | Hagenauer et al. .......... | 375/341 |
| 2002/0154712 | A1* | 10/2002 | Cideciyan et al. ........... | 375/341 |
| 2003/0053557 | A1* | 3/2003 | Simon et al. ................ | 375/308 |
| 2004/0081248 | A1* | 4/2004 | Parolari ...................... | 375/259 |
| 2009/0074096 | A1* | 3/2009 | Hansen et al. .............. | 375/260 |

OTHER PUBLICATIONS

Kim et al., "Anti-jamming Performance of Slow FH-CPM Signals with Concatenated Coding and Jamming Estimation", IEEE Military Communications Conference, Oct. 16-18, 2003, pp. 1120-1125.
Brown et al. "A Reduced Complexity Iterative Non-coherent CPM Detector for Frequency Hopped Wireless Military Communication Systems", MilCom, Oct. 2005.
Divsalar et al. "Multiple-Symbol Deferential Detection of M-PSK", IEEE Transactions on Communications, vol. 38, pp. 300308, Mar. 1990.
Simon et al. "Maximum-Likelihood Block Detection of Noncoherent Continuous Phase Modulation", IEEE Transactions on Communications, vol. 41, No. 1, Jan. 1993, pp. 90-98.

(Continued)

*Primary Examiner*—Emmanuel Bayard
(74) *Attorney, Agent, or Firm*—Teitelbaum & MacLean; Neil Teitelbaum; Doug MacLean

(57) ABSTRACT

The invention relates to a method of non-coherent decoding an encoded CPM signal received by a wireless receiver, and a CPM decoder implementing the method, wherein the signal is generated by a transmitter using a serial concatenation of an outer encoder, an interleaver and an M-ary CPM modulator, and may have a frequency-hopping RF carrier. In a preferred embodiment, the method includes iteratively decoding the received signal by first recursively finding a sub-set of dominant sequences of CPM symbols that maximize a path metric for one hop interval using a non-coherent CPM detector, determining on the basis of this sub-set a sequence of soft inner bits, decoding these soft inner bits with an outer decoder, and using extrinsic information for the soft inner bits provided by the outer decoder to iteratively update the sub-set of dominant sequences of CPM symbols in the inner CPM detector.

21 Claims, 5 Drawing Sheets

OTHER PUBLICATIONS

Narayanan et al. "Performance of Trellis-coded CPM with Iterative Demodulation and Decoding", IEEE Transactions on Communications, vol. 49, No. 4, Apr. 2001, pp. 676-687.

Huber et al. "An Alternative Approach to Reduced-Complexity CPM-Receivers", IEEE Journal on Selected Areas in Communications, vol. 7, No. 9, Dec. 1989, pp. 1437-1449.

Andersson et al. "Noncoherent Detection of Convolutionally Encoded Continuous Phase Modulation" IEEE Journal on Selected Areas in Communications, vol. 7, No. 9, Dec. 1989, pp. 1402-1414.

* cited by examiner

ITERATIVE NON-COHERENT CPM DECODER

CROSS-REFERENCE TO RELATED APPLICATIONS

The present invention claims priority from U.S. Provisional Patent Application No. 60/678,226 filed May 6, 2005, entitled "A Reduced Complexity Iterative Non-coherent CPM Detector for Frequency Hopped Wireless Military Communication Systems", which is incorporated herein by reference for all purposes.

TECHNICAL FIELD

The present invention generally relates to wireless communications, and more particularly to reduced-complexity iterative methods of decoding of serially encoded continuously phase modulated signals, and to wireless detectors implementing such methods.

BACKGROUND OF THE INVENTION

Next generations of wireless communication systems are likely to include data rates in the order of several Mbps using digital modulation formats having good spectral efficiency and high tolerance to external interferences, such as jamming in military applications or RF signals from other communication systems or other members of the same wireless network. In addition, modulation formats having small dynamic range of transmitted signal power may be preferred since they do not require linear amplification over a large dynamic range and thus enable using low-cost power-efficient amplifiers.

These requirements can be satisfied in communication systems using spread spectrum (SS) transmission techniques and continuous phase modulation (CPM). The CPM waveform is characterized in that the transmitted information is contained in the phase of the transmitted electromagnetic signal which changes continuously from symbol to symbol, while the signal envelope remains substantially constant. With BPSK (binary phase shift keying) a logic one is transmitted as one phase of a modulated signal and a logic zero is transmitted as a 180-degree shifted phase with a sharp transition in phase. This sharp phase transition results in broadening of the transmitted spectrum. With CPM the phase of the transmitted signal makes smooth phase changes over the symbol transitions of the modulating digital signal. A particular form of CPM is minimum-shift keying (MSK), in which the phases that the modulated signal is permitted to take at a given symbol time are only the phases adjacent to the previous symbol phase. M-ary CPM formats are possible wherein each CPM symbol interval contains $m_b = \log_2(M)$ bits of information.

Receivers of wireless CPM signals are generally divided according to the phase detection methods used therein into coherent and non-coherent receivers. To accomplish coherent detection, the phase of the received signal has to be continuously recovered and estimated prior to de-modulation and detection of the information symbols. Non-coherent receivers require only a phase difference of the received signal to be analyzed over a relatively short time interval of at least two symbol durations and are designed to average the phase of the received signal thus substantially ignoring the effects of phase error in the de-modulation and detection of the information symbols.

In a typical communication channel the wireless signal experiences signal deterioration, e.g. due to the presence of noise, which introduces phase errors and loss of the data when the signal is demodulated at a receiver in the communications link. These errors can be at least partially recovered using channel encoding at the transmitter, thereby enabling forward error correction, and channel decoding at the receiver. Traditionally, coherent receivers have been known to enable better error correction performance than non-coherent receivers, due to the additional phase information that such receivers can use at the decoding stage. However, such detectors require complicated arrangements for phase recovery and complicated signal processing techniques, where sometimes the number of signal states that have to be analyzed are quite large.

The coherent detection becomes even more problematic if the CPM format is combined with a spread spectrum technique of frequency hopping (FH), e.g. to reduce external interference such as jamming. In this context, a high data rate CPM transmission is attainable for so-called slow FH, when multiple symbols are transmitted during one hopping period. One problem with using CPM in slow FH, however, is the phase discontinuity of the CPM symbols between adjacent hop intervals that precludes many conventional methods of phase recovery. Coherent detection of the FH CPM signals is nevertheless possible by correcting the phase discontinuity via suitable choice of a preamble signal prior to the detection. However, this requires a dedicated preamble signal embedded in the transmission waveform during each hop interval, which reduces the spectral efficiency of the transmission scheme.

Therefore, it would be advantageous to use a non-coherent detection technique to detect and decode CPM signals, and a number of such techniques have been disclosed in the art. However, many conventional non-coherent CPM detectors either suffer from a considerable, as high as 3 dB, penalty in signal to noise ratio (SNR) compared to the optimal coherent detectors, or require excessively complex processing. For example, U.S. Pat. No. 5,017,883 in the names of Divsalar and Simon teaches a multiple symbol differential detection technique (MSDD) which uses a multiple symbol observation interval on the basis of which a joint decision is made regarding the phase of the received symbols. This method is capable of providing a good SNR for long observation intervals, but at the expense of examining a very large number of possible symbol sequences to make optimal decisions.

The low SNR performance of transmission systems using CPM formats can be improved using channel coding. Block codes and convolutional codes are two types of channel codes commonly used in the art of channel coding. A block code is an error detection and/or correction code in which an encoded block of data consists of n encoded bits, containing k information bits (k<n) and n-k redundant check bits to detect and/or correct most errors. Types of block codes known in the art include Hamming codes, Golay code, B CH codes, and Reed Solomon codes.

Convolutional codes are widely used in the communications art to provide error correction. Convolutional codes continuously convert an entire data stream to encode the k information bits. The encoded bit stream depends on the current information bits and also on the previous input information bits. With a convolutional code, k information bits are encoded into n encoded bits in an encoder with m memory stages that store the state information of the encoder. A constraint length K of a convolutional code is defined as m+1 and a code rate r as k/n. The well-known Viterbi algorithm is commonly used to decode convolutional codes.

Known decoding approaches can be divided in two categories in accordance with how they utilize an incoming analogue information stream: these are a hard-decision decoding and a soft decision decoding. Hard-decision decoders start with input information in a digitized form of code symbols, or "hard decisions", and use decoding algorithms to attempt to correct any errors that have occurred. Soft-decision decoding (SDD) on the other hand utilizes additional information present in the received data stream. SDD starts with soft decision data that may include hard information indicating which value each received symbol is assigned (e.g. a "1" or a "0" for binary symbols) and an associated value that indicates a reliability or confidence that the value assigned to a particular received symbol is correct. This is generally referred to as "soft input" information. A decoder then utilizes the soft input information to decode the received information so as to produce a code word most likely to represent the original transmitted data.

Most of decoding methods for soft-in, soft-out (SISO) decoding are approximate implementations of an a-posteriori probability (APP) decoder, also referred to as the maximum a posteriori (MAP) decoder. An APP decoder finds a probability of each data symbol at each symbol time given the entire received signal. This is in contrast to the well-known Viterbi algorithm, which finds the entire sequence that was most likely transmitted given the received signal. Both algorithms are optimum for their respective criteria, but the APP decoding scheme more naturally provides the soft output information. Log-APP is a form of APP processing where the quantities manipulated are not probabilities, but rather "log-probability quantities" derived from probabilities. The term "log-probability quantity," herein refers to log-probabilities, log-probabilities with offsets, sums of log-probabilities, differences of log-probabilities, and combinations of these. Note that a "log-probability" is simply a logarithm of a probability; the base of the logarithm is arbitrary. Manipulating log-probability quantities, rather than working with the probabilities themselves, is generally preferred due to computational issues such as a finite-precision representation of numbers.

Recently, an efficient coding technique, called turbo coding, requiring SISO decoding have been developed, enabling data transmission performance near the theoretical limit. A turbo code is generated at a transmitter by a serial or parallel concatenation of two or more component codes, often recursive convolutional codes, each separated by an interleaver. Turbo decoding at a receiver uses a soft decoder at the input followed by an inverse interleaver and a second soft decoder. The output of the second soft decoder feeds back to the input of the first soft decoder through an interleaver. The data is passed through the turbo decoder in several iterations with each pass improving the quality of error correction.

Serially concatenated codes that use the CPM as the inner recursive code have been shown to offer good error correction performance when coupled with turbo-like SISO decoders based on the APP. The BEAM modem described in U.S. Pat. No. 6,968,021 provides an example of turbo-like decoder for such a serially-encoded CPM signal, wherein an inner coherent CPM decoder and an outer trellis-based decoder cooperate to iteratively improve the error correction. However, the BEAM receiver requires a computationally complex coherent inner CPM decoder and an involved phase recovery mechanism for achieving the coherent detection.

In another example of prior-art iterative CPM decoding, a paper by H. Kim, Q. Zhao, G. L. Stuber, and K. R. Narayanan, entitled "Anti-jamming Performance of Slow FH-CPM Signals with Concatenated Coding and Jamming Estimation", in IEEE Military Communications Conference, Oct. 16-18, 2003, teaches non-coherent CPM detection in application to frequency hopping in a tactical environment. In this article, an iterative MAP based approach to detecting the CPM signal over one hop duration is presented. The inner CPM decoder taught in this article is based on the MSDD technique, which may require significant computational recourses.

An object of this invention is to provide an efficient iterative non-coherent detector for encoded CPM signals.

Another object of this invention is to provide a low complexity method of iterative decoding of serially encoded CPM signals.

Another object of this invention is to provide a low-complexity iterative non-coherent detector for frequency-hopping encoded CPM signals.

SUMMARY OF THE INVENTION

In accordance with the invention, a method is provided for non-coherent decoding of a serially encoded CPM signal generated by a transmitter comprising an outer encoder, an interleaver and an $M_c$-ary CPM modulator operatively connected in series, wherein said signal was transmitted via a communication channel corrupting the serially encoded CPM signal and received by a receiver, the method comprising the steps of: a) selecting a portion of the serially encoded signal modulated with a sequence of N consecutive Mc-ary symbols to form a decoding signal block, b) selecting a sub-set of sequences of N Mc-ary symbols that maximize a path metric for the decoding signal block among all possible sequences of N $M_c$-ary symbols, c) generating a plurality of bit-level inner encoded extrinsic information values for the decoding signal block on the basis of the selected sub-set of all possible sequences of N Mc-ary symbols using corresponding path metrics, d) processing the plurality of bit-level inner extrinsic information values with an outer decoder to obtain an encoded plurality of outer bit-level extrinsic information values and a decoded plurality of outer bit-level extrinsic information values, e) updating the sub-set of all sequences of N Mc-ary symbols using the plurality of outer bit-level extrinsic information values to update the path metrics, and f) outputting the decoded plurality of outer bit-level extrinsic information values after repeating steps (c) and (d).

In accordance with another aspect of the invention, a method for non-coherent decoding of the CPM signal received by the receiver via a communication channel comprises the steps of: a) identifying CPM symbol positions in the received CPM signal; b) selecting a portion of the received CPM signal comprising N consecutive CPM symbol positions; c) generating a sequence of $N_b=N*\log_2(M_c)$ inner extrinsic information values for the selected portion of the received CPM signal from $N_b$ a-priori information values and $N \cdot M_c$ branch metrics using a recursive search algorithm, wherein at each step of said algorithm at most M tree paths are retained, wherein each tree path corresponds to a sequence of up to N $M_c$-ary symbols and is selected using a path metrics that accounts for one or more of the $N_b$ a-priori information values, and wherein branch metrics are obtained for each symbol position by filtering the received CPM signal about the symbol position with a plurality of filters that are matched to possible CPM waveforms for said symbol interval, and wherein $1<M<M_c^N$; d) providing the sequence of $N_b$ inner extrinsic information values to an inverse interleaver to form a de-interleaved sequence of inner information values, and sending said de-interleaved sequence to an outer SISO decoder; e) generating a sequence of $N_b$ encoded outer extrinsic information values using the outer SISO decoder from said de-interleaved sequence; f) interleaving the sequence of $N_b$ encoded outer extrinsic information values to generate the set of $N_b$ a-priori information values, and providing said set of $N_b$ a-priori information values to the inner CPM decoder; g) iteratively repeating the sequence of steps (c)-(f); and, h) generating a decoded sequence of $N_b$ soft outer extrinsic values obtained by the outer SISO decoder from the $N_b$ de-interleaved inner extrinsic information values.

Another aspect of the invention provides a non-coherent receiver for receiving and decoding a CPM signal R(t) received by a wireless receiver via a communication channel, the CPM signal generated from a sequence of input information binary bits by performing the steps of encoding the input binary bit sequence with an outer encoder to obtain a encoded binary bit sequence, interleaving the encoded binary bit sequence with a transmitter interleaver to obtain an interleaved binary bit sequence, mapping the interleaved binary bit sequence to a sequence of $M_c$-ary symbols, modulating an RF carrier signal using a $M_c$-ary CPM modulator to form an RF CPM signal, and transmitting thereof via the wireless communication channel.

The non-coherent receiver comprises the following elements: a non-coherent frequency down-converter for down-converting the received CPM signal R(t) to obtain a down-converted signal including N consecutive CPM symbol intervals, a non-coherent CPM detector, comprising a bank of CPM waveform matched filters for obtaining $M_c$ branch metrics for each of the N consecutive CPM symbol intervals by filtering the down-converted signal in the respective symbol intervals, and an inner recursive CPM SISO processor coupled to the CPM waveform matched filters for receiving the branch metrics and $N_b$ a-priori information values, and for recursively forming therefrom a sequence of $N_b = N*\log_2(M_c)$ inner extrinsic information values for the N consecutive CPM symbol intervals. The non-coherent receiver further comprises: a de-interleaver for de-interleaving the sequence of $N_b$ inner extrinsic information values and for providing a sequence of $N_b$ de-interleaved soft information values, an outer SISO decoder for generating soft encoded outer extrinsic information values and soft decoded outer extrinsic information values, and a feedback link from the outer decoder to the inner recursive CPM SISO decoder for providing the encoded outer extrinsic information values thereto as the a-priori information values, the feedback link including an interleaver. The inner CPM SISO decoder generates the sequence of $N_b$ inner extrinsic information values on the basis of the branch metrics and the $N_b$ a-priori information values obtained from the outer SISO decoder using a recursive tree search algorithm wherein at most M tree paths are retained at each step, $1 < M < M_c^N$, each tree path corresponding to a different sequence of $M_c$-ary CPM symbols for the N consecutive CPM symbol intervals.

BRIEF DESCRIPTION OF THE DRAWINGS

The invention will be described in greater detail with reference to the accompanying drawings which represent preferred embodiments thereof, wherein.

DETAILED DESCRIPTION

The instant invention provides method and system for non-coherent detection and decoding of a serially concatenated encoded CPM signal using a non-coherent iterative limited tree search algorithm and a recursive inner CPM detector. Advantageously, the method and system of the present invention enable near-optimal detection using a low-complexity CPM detector that does not require phase recovery circuits, and that can be used in frequency-hoping (FH) wireless communications as well as in communication systems without frequency hopping.

Figure 1:
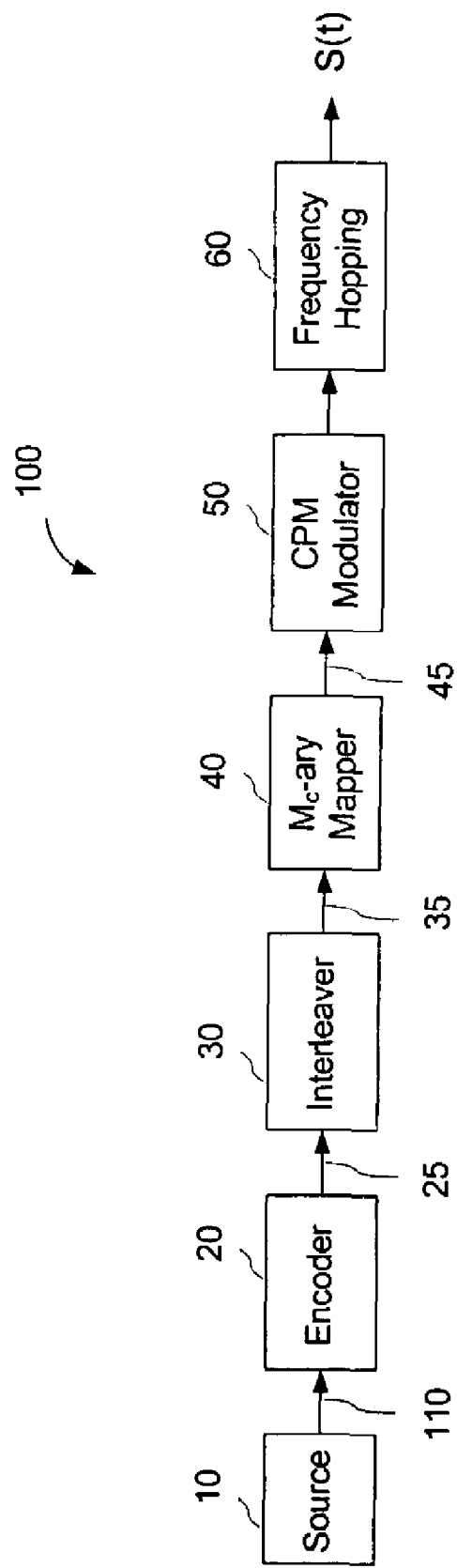
FIG. 1 is a diagram of a prior-art FH transmitter for transmitting a serially encoded CPM signal.
Figure 2:
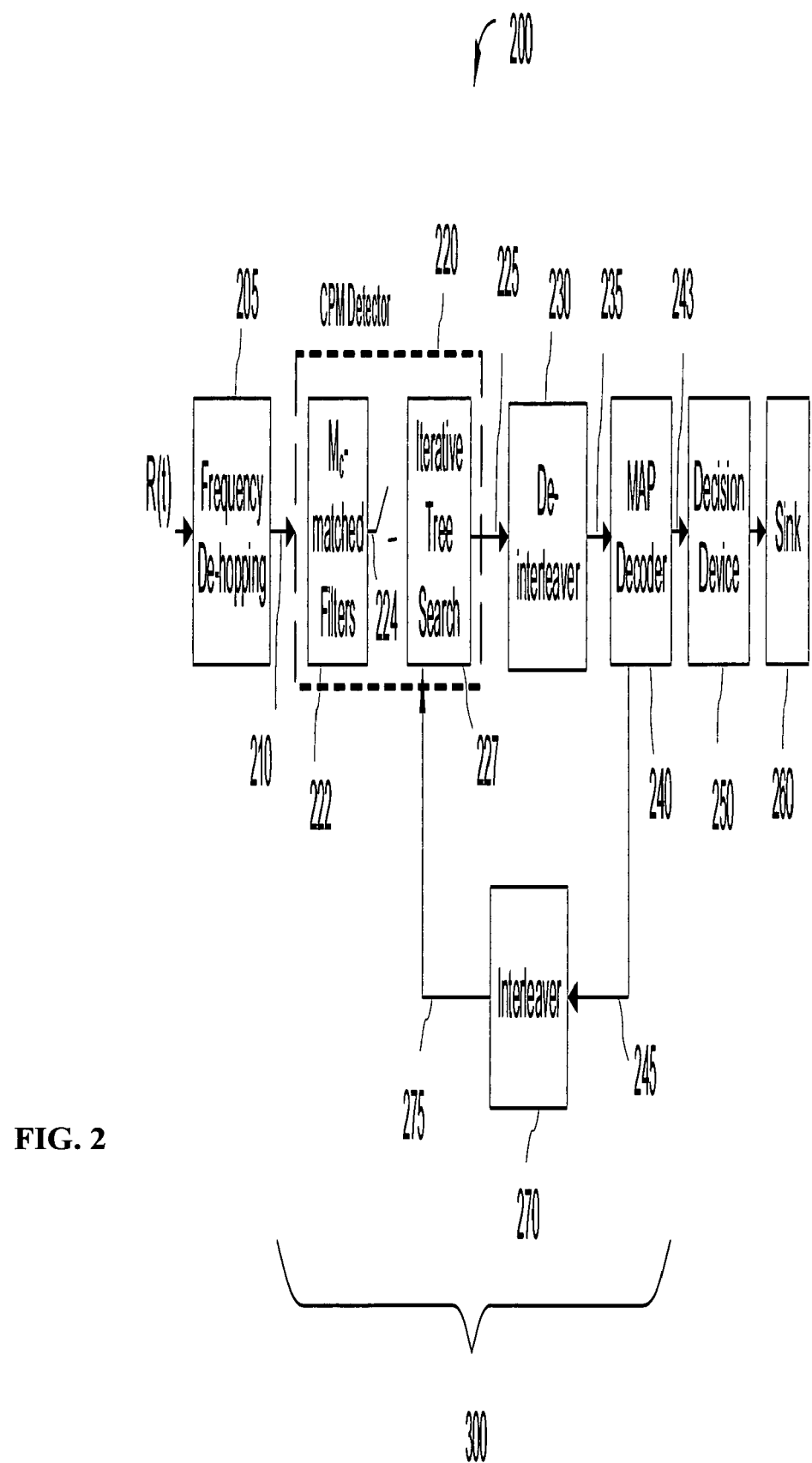
FIG. 2 is a general diagram of a non-coherent FH receiver according to the present invention.
Figure 3:
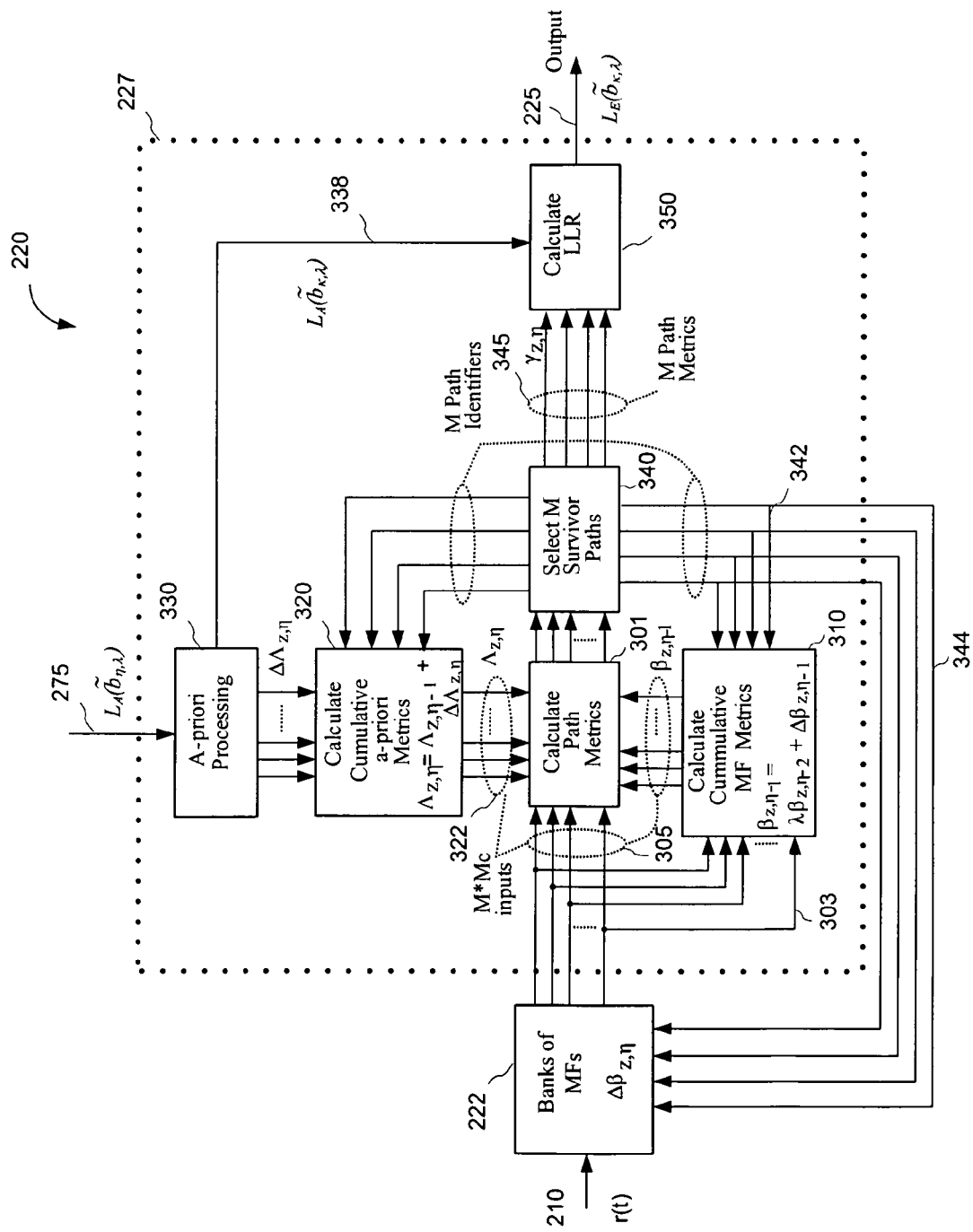
FIG. 3 is a diagram of the inner non-coherent recursive CPM decoder according to the present invention.

Exemplary embodiments of the system and method of the current invention will now be described with references to transmitter and receiver diagrams shown in FIGS. 1-3, wherein each block represents a functional unit of the transmitter or receiver adopted to perform one or several steps of the respective methods of transmitting or receiving a serially-encoded CPM signal; for example, functional blocks shown in FIGS. 2 and 3 represent functional units of the receiver of the present invention adopted to perform one or several steps of the method of the present invention of non-coherent detection of serially-concatenated frequency-hopped CPM signal in one embodiment thereof; these steps will be also hereinafter described in conjunction with the description of the corresponding functional blocks of the receiver.

The various functional units shown as blocks in FIGS. 1-3 can be integrated or separate structures implemented in either software or hardware or a combination thereof commonly known to provide the aforedescribed functionalities, including DSPs, ASICs, FPGAs, and analogue RF, HF and UHF circuitry.

FIG. 1 shows a general scheme of a transmitter module for generating a serially encoded CPM signal. FIG. 1 is purposely generic, since its sole purpose is to introduce the basic elements of the channel preceding the receiver shown in FIGS. 2 and 3, where the invention actually resides.

The transmitter 100 receives an input stream 110 of data symbols $a_{in} = [\ldots a_1, a_2, \ldots]$ at an input data rate R bits/sec from an information source 10, and generates an RF signal $u(t,\alpha)$ comprising a modulated frequency-hopping carrier. In the embodiment described herein, the input data symbols $\alpha_i$ are binary symbols, or binary information bits; in other embodiments they can be any symbols suitable for transmitting and processing of digital information. In the context of this specification, the terms "binary symbols", "binary bits", and "bits" are used interchangeably to mean a quantum of information that can be either a logical one or a logical zero, or a digitized signal carrying this information that can take one of only two pre-defined values, depending on a context. The input stream of data symbols 110, also referred to hereinafter as the input data stream or as an input binary bit sequence, can carry any type of information, including but not limited to digitized voice, video and data.

The binary bit sequence 110 $a_{in}$ is encoded by an encoder 20 using in one embodiment a convolutional rate n/c error correction code, so that each consecutive n input bits $a_i$ are converted into c output bits $b_i$ resulting in the encoded binary sequence b. In other embodiments, the encoder 20 can be a block rate n/c encoder. Next, the encoded bit sequence b 25 of the encoder 20, also hereinafter referred to as encoded outer bits 25, is pseudo-randomly bit-interleaved by an interleaver 30 to avoid burst of errors at the receiver; an interleaved binary bit sequence b̃ produced by the interleaver 30, which is represented by an arrow 35 in FIG. 1 and is also referred to hereinafter as the inner bits 35, is then sent to an $M_c$-ary mapper 40, for mapping it onto a symbol sequence a consisting of $M_c$-ary symbols $\alpha_k$, each of which can take one of the following $2M_c$ values: $\pm 1, \pm 3, \ldots,$ and $\pm(M_c-1)$, i.e. $\alpha_k \in \{\pm 1, \pm 3, \ldots \pm(M_c-1)\}$, wherein $M_c=2^{m_b}$, so that a k-th $\alpha$ symbol represents a sub-sequence $\tilde{b}_k=[\tilde{b}_{k,0}, \tilde{b}_{k,1}, \ldots, \tilde{b}_{k,m_b-1}]$ of $m_b$ bits of the bit sequence $\tilde{b}$, $\tilde{b}_{k,l}$ representing the $l^{th}$ of the $k^{th}$ symbol $\alpha_k$. Here, $m_b$ is an integer equal or greater than 1 and represents the number of information bits in each $\alpha$ symbol.

The resulting stream $\alpha$ of the symbols $\alpha_k$, hereinafter commonly referred to as $\alpha$ symbols, is provided as an input to an $M_c$-ary CPM modulator 50, which forms a constant-envelope CPM waveform $s(\alpha,t) \sim \exp(j \cdot \psi(\alpha,t))$ with a phase function $\psi(\alpha,t)$ according to the selected $M_c$-ary CPM format as described hereinbelow, which is then used by an RF signal generating unit 60 to modulate the phase of a frequency-hopping RF carrier signal $\exp(j\omega_m t)$ having a hopping carrier frequency $\omega_m=2\pi f_m$. A resulting encoded FH-CPM signal $(t, \alpha)$ carrying the input information is then sent to an RF transmitting unit for transmission over a wireless communication channel.

The interleaver 30 has a length I and is preferably a pseudo-random interleaver, but can be any suitable interleaver that re-orders bits within each consecutive block of I binary bits, hereinafter referred to as the interleaver block, according to a pre-defined algorithm; the interleaver 30 may include a buffer of length I bits.

The carrier signal "hops" in the frequency domain to another carrier frequency $f_m$ at time moments $t_m=t_0+m \cdot T_h$, wherein $t_0$ is an arbitrary time offset, $T_h$ is a duration of a time interval between the hops when the sub-carrier frequencies remain constant, and m is a hop index; we will assume here for simplicity that m can take any integer value between $-\infty$ and $+\infty$, i.e. $m=-\infty, \ldots, +\infty$. The time-dependent hopping frequency $f_m$ can be therefore described by the following equation (1):

$$f(t) = \sum_{m=-\infty}^{m=\infty} f_m \cdot p(t-t_m), \qquad (1)$$

$$p(x) = \begin{cases} 1, & x \in [0, T_h) \\ 0, & x < 0, x \geq T_h \end{cases}$$

The sequence of frequencies $f=[\ldots f_{m-1}, f_m, f_{m+1} \ldots]$ will be referred to herein as a frequency hopping sequence. The time interval $(t_m, t_{m+1})$ between consecutive hops will be referred to hereinafter as a hop interval. The frequency hopping sequence is selected according to a pre-defined algorithm know to the receiver, which is preferably pseudo-random, but can be also any other suitable algorithm, including a conventional fixed-frequency implementation wherein the carrier frequency remains substantially constant during the transmitter operation, and no frequency hopping occurs.

The encoded FH-CPM RF signal $u(t,\alpha)$ generated by the transmitter 100 is phase continuous during each hop period but has a phase discontinuity at the start of each new hop; it can be represented by equation (2)

$$u(t, \alpha) = \sum_{m=-\infty}^{\infty} p(t-mN_h T_s) \text{Re}\{s(t, \alpha)e^{j\omega_m t}\} \qquad (2)$$

where $T_s$ is the CPM symbol period, $N_h$ is the number of symbols in a hop interval $T_h$, Re $\{x\}$ denotes the real part of x, and $s(t,\alpha)=A\, e^{j\psi(t,\alpha)}$, where A is the gain of the CPM signal and $\psi(t,\alpha)$ represents the information carrying phase function given by $$\psi(t, \alpha) = 2\pi \sum_{i=-\infty}^{\infty} \alpha_i h_i q_i(t-iT_s) \qquad (3)$$

where $h_i$ is the modulation index, i is a symbol counter, and $$q(t) = \int_{-\infty}^{t} g(\tau) d\tau$$

is a phase response function with memory that is determined by a frequency pulse $g(t)$.

For certainty, the phase pulse $q(t)$ is assumed to be normalized and time-limited so that $q(t)=0$ if $t \leq 0$, and $=\frac{1}{2}$ if $t > L \cdot T_s$, where integer $L \geq 1$ is referred to as the CPM memory length, or simply the CPM memory. The frequency pulse $g(t)$ occupies L symbol intervals $T_s$, and the CPM format is referred as a full-response CPM if L=1, i.e. the CPM is memory-less, and as a partial-response CPM if L>1. During an n-th symbol interval $n \cdot T_s \leq t < (n+1) \cdot T_s$, the information-carrying phase function (3) can be represented by a CPM symbol phase function $$\psi_n(\alpha, t) = \pi h \sum_{i=-\infty}^{n-L} \alpha_i + 2\pi h \sum_{i=n-L+1}^{n} \alpha_i q(t-iT_s) \qquad (4)$$

which is continuous at the symbol transition instants $t=nT_s$. The complex function $\exp[j \cdot \psi_n(t, \alpha)]$ within the n-th CPM symbol interval will be referred to hereinafter as the CPM symbol waveform for the n-th symbol interval. As follows from equation (4), this CPM symbol waveform has a memory of length (L-1), i.e. it's phase shape depends on (L-1) preceding $\alpha$ symbols if L>1.

As it is known in the art, the CPM modulator 50 is equivalent to a recursive convolutional encoder, also referred to as the continuous phase encoder (CPE), combined with a memoryless mapper. The combination of the outer convolutional encoder 20, the interleaver 30 and the CPM mapper/modulator 40, 50 can therefore be considered as a serial concatenated convolutional code (SCCC) with a recursive inner encoder, the code which is known to provide large gain in a signal to noise ratio (SNR) at the receiver for a suitably large interleaver size I.

The transmitter generated RF signal $u(t,\alpha)$, after propagating though the radio communication link where it experiences linear distortions, channel fading and external signal interference in the form of additive noise and, possibly, jamming, is received by a non-coherent iterative receiver in the form of a received RF FH signal $$R(t)=r(t) \cdot \exp(j\omega_m t).$$

The non-coherent iterative receiver of the present invention is adapted to extract from the frequency-hopping RF signal R(t) a binary sequence that closely approximates the input binary information sequence 110 that was used to modulate the transmitter 100, preferably with a suitably small number of errors at a given strength of the received signal. This non-coherent receiver realizes a relatively simple and computationally efficient method of the present invention for demodulating and decoding such a serially concatenated CPM signal, and provides performance comparable to a considerably more complex optimal coherent receiver.

The receiver and the corresponding CPM decoding method of the present invention it implements will now be first discussed with reference to FIG. 2, schematically showing an embodiment 200 of said receiver. Features of this receiver are also generally described in an article by the inventors of the present invention entitled "*A Reduced Complexity Iterative Non-coherent CPM Detector for Frequency Hopped Wireless Military Communication Systems*", published in MilCom 2005, October 2005, which is incorporated herein by reference.

Similarly to FIG. 1, each block in the diagrams shown in FIGS. 2 and 3 is a functional unit of the receiver adopted to perform one or several steps of the method of receiving of the frequency-hopped encoded CPM signal of the present invention in one embodiment thereof; these steps will be also hereinafter described in conjunction with the description of the corresponding functional blocks of the receiver. Note also that functioning of the CPM receiver 200 of the present invention is described herein using mathematical formulas that are derived under certain assumptions and approximations; these assumptions and approximations are used for clarity of the description and for illustration purposes, and should not be considered as limiting the scope of the invention.

Turning first to FIG. 2, the non-coherent iterative receiver 200 includes an RF receiving unit 205, a non-coherent CPM detector/demodulator 220, and an outer MAP decoder 240 following a de-interleaver 230. The RF receiving unit 205 conventionally includes an RF antenna, a local oscillator and an RF mixer, which are well known in the art and not shown here, for down-converting and de-hopping the received RFFH signal. The local oscillator is synchronized to the corresponding local oscillator of the transmitter 100, and, when the frequency-hopping RF signal R(t) is received, produces a harmonic RF signal following the same hopping frequency sequence $\{f_m\}$ as the one used by the transmitter 100, possibly with a constant frequency offset termed as an intermediate frequency (IF). The RF receiving unit thereby converts the received frequency-hopping RF signal into the baseband signal $r_m(t)$, or optionally into an IF signal $r_{IF}(t)=r_m(t)\exp(j\omega_{IF}t)$. Assuming a perfect transmitter-receiver frequency synchronization and slow channel fading, the baseband signal $r_m(t)$ represented by an arrow 210 at the output of the RF receiving unit 205 during an m-th hop interval $t_m < t < t_{m+1}$, $t_m = mN_hT_s$ denoting a beginning of the m-th hop, can be approximately described by the following equation (5):

$$r_m(t) = s_m(t, \alpha)e^{j\theta_m(t)} + w_m(t) \quad (5)$$

where $w_m(t)$ represents additive zero mean white Gaussian noise (AWGN) with a two-sided spectral density $N_0$ W/Hz, and $\theta_m(t)$ represents an arbitrary phase which accounts for a combined effect of time varying transmission characteristics of the communication channel and phase discontinuities resulting from the frequency hopping, as represented by the FH pulse function p(t). Most of the following description is given with reference to a signal received during one hop interval, and the hop index "m" of the down-converted received signal $r_m(t)$ can be omitted, so that in the following $r(t) \equiv r_m(t)$.

The baseband signal r(t) is passed to the non-coherent CPM detector 220, which includes a bank of adaptive matched filters (MFs) 222 followed by a symbol rate sampler 224 and an iterative tree search (ITS) processor 227. In one embodiment, the baseband signal r(t) is first sampled by the A/D converter (not shown) at a sample rate that is preferably higher than the CPM symbol rate $1/T_s$, so that each CPM symbol interval $T_s$ includes several sampling points, and then filtered by the matched filter bank including a plurality of adaptive filters, each of which matched to a different one of possible CPM waveforms for a current symbol interval, as described hereinafter. The output of each of the matched filters in the filter bank 222 is then down-sampled by a sampler 224 to produce a parallel sequence of branch metrics values at the CPM symbol rate as described more in detail hereinbelow, said parallel sequence forming one of two inputs of the recursive tree search processor 227. A timing synchronization circuit (not shown) is used to time-synchronize the sampler 224 to symbol intervals of duration $T_s$ in the received baseband signal r(t).

In an alternative embodiment, the MF bank 222 operates not on the baseband signal, but on the IF signal $r_{IF}(t)$ to obtain the metrics values. To account for this variation, the baseband signal r(t) and the IF signal $r_{IF}(t)$ are commonly referred to in this specification as the down-converted signal.

In yet another embodiment, the filter bank 222 can include analogue matched filters rather than digital, thus obviating the need for the A/D converter prior to the matched filter bank 222.

The CPM detector 220 outputs soft information values represented by an arrow 225 for the inner bits 35 generated by the transmitter interleaver 30. These soft information values, or soft inner bits 225 are then fed into a de-interleaver 230, which de-interleaves blocks of I soft bit values using an algorithm that is the inverse of the interleaving algorithm of the transmitter interleaver 30, and passes soft values 235 for the encoded outer bits 25 onto the outer decoder 240. The outer decoder 240 for decoding the outer code of the transmitter encoder 20 uses the known structure of the outer code for additional error correction, and then outputs a sequence 245 of "corrected" soft values for the encoded bits 25 as a feedback for the CPM detector 220, in addition to outputting a de-coded bit sequence 243 to a decision device 250 for making hard decisions thereupon. The CPM detector 220 uses the soft feedback from the outer decoder 240 "re-interleaved" by an interleaver 270 as a-priori information for inner bits 45 to update the soft information values generated by the CPM detector 220 for said inner bits in a next iteration.

The aforedescribed decoding process is generally known as turbo decoding, or as iterative decoding of serially concatenated codes. In a preferred embodiment, both the inner CPM detector 220 and the outer decoder 240 implement a maximum a-posteriori (MAP) decoding approach, or an approximation thereto, wherein a probability value is generated for each bit of a received "soft" encoded sequence based on the whole encoded sequence and known structure of the inner CPM code. MAP decoding amounts to determining so-called extrinsic information for each transmitted bit, meaning "extra" information in addition to the soft bit information input to the receiver, which is derived from a known structure of the transmitted code and soft input information for other bits in the received sequence excluding the current bit. Accordingly, the soft information values 225 and 245 generated by the inner CPM detector 220 and the outer decoder 240 respectively are extrinsic information values for the inner bits 45 and outer bits 25 of the transmitted sequence, and will be referred to hereinafter also as the inner extrinsic values 225 and outer (encoded) extrinsic values 245.

The extrinsic information can be computed as a log-likelihood ratio, or an approximation thereto, for a given bit based on the log-likelihood ratios of all the other bits excluding the given bit in a given sequence. A "log-likelihood ratio" (LLR) is a logarithm of a probability ratio, that is, a difference between two log-probabilities; it is a common log-probability quantity used in MAP processing. For a binary case, the log-likelihood ratio for a received "soft" i-th sample $y_i$ being a '0' bit is defined as:

$$LLR_i = \log(Pr\{v_i = '1'\}/Pr\{v_i = '0'\})$$

where $Pr\{v_i = '0'\}$ is a probability of the bit $v_i$ being a '0' bit. The log-likelihood ratio of the given bit based only on the input soft information for this bit is commonly referred to as the "intrinsic information"

MAP processing typically involves finding a most likely (ML) sequence of symbols given the received signal, and provides better error correction performance when longer received sequences are used to determine the extrinsic information values for each symbol position. However, the task of finding the ML sequence generally involves examining all possible symbol sequences of a given length, the number of which increases exponentially as the sequence length increases, thereby quickly rendering the method impractically complex when the number of symbol positions in the sequence is large. Therefore, prior art solutions to decoding of CPM signals typically involve using ML block detection with relatively small decoding windows, or blocks, such as e.g. a multi-symbol differential detection (MSDD) method described by D. Divsalar and M. K. Simon in a paper entitled "Multiple-Symbol Deferential Detection of M-PSK", IEEE Transactions on Communications, vol. 38, pp. 300308, March 1990.

Considering a block of N consecutive CPM symbol intervals, the inner extrinsic information values for the k-th CPM symbol interval within the block can be generated by computing a LLR for each inner encoded bit $\tilde{b}_{k,l}$ for the k-th symbol interval, and subtracting from it an a-priori information value $L_A(\tilde{b}_{k,l})$ for the given encoded bit obtained from the outer decoder 240:

$$L_E(\tilde{b}_{k,l}) = \log\left(\frac{\sum_{z:\tilde{b}_{k,l}=1}\left[p(r(t)|s_z)\prod_{j=0}^{N-1}P(\alpha_{z,j})\right]}{\sum_{z:\tilde{b}_{k,l}=0}\left[p(r(t)|s_z)\prod_{j=0}^{N-1}P(\alpha_{z,j})\right]}\right) - L_A(\tilde{b}_{k,l}) \quad (6)$$

wherein $p(r(t)|s_z)$ is a phase-averaged conditional probability that the received baseband signal r(t) within an observation window of width $N \cdot T_s$ corresponds to a transmitted CPM waveform $s_z = s(t, \alpha_z)$, where the subscript z is a counter of all possible sequences of N CPM symbols for the block of N consecutive CPM symbol intervals. $P(\alpha_{z,j})$ represents an a-priori probability for a particular $\alpha$ symbol to be found in a j-th symbol interval in the z-th possible sequence; it can be computed from the a-priori bit values $L_A(\tilde{b}_{k,l})$. The summations in the numerator and denominator of the first term in the R.H.S. of equation (6) are performed over all possible transmitted CPM waveforms $s_z$ that correspond to $\tilde{b}_{k,l}$="1" and $\tilde{b}_{k,l}$="0", respectively.

For a partial-response CPM with memory L>1, the shape of each of the CPM waveforms $s_z$ of duration $N \cdot T_s$ is determined by a sequence $\alpha_z$ of $\alpha$ symbols of length $N_L = (N+L-1)$, i.e. $\alpha_z = \{\alpha_{z,1-L}, \ldots, \alpha_{z,k}, \ldots, \alpha_{z,N-1}\}$, $z=0, \ldots, M_c^{N_L}-1$, and therefore there are $M_c^{N_L}$ possible CPM waveforms $s_z$ to be examined.

The phase-averaged conditional probability satisfies the following equation:

$$p(r(t)|s_z) = FI_0\left(\frac{2}{N_0}|\beta_z|\right) \quad (7)$$

where $I_0()$ is the modified zero order Bessel function, and $\beta_z$ is a complex correlation parameter defined by equation (8):

$$\beta_z = \int_N^{(t_N+N \cdot T_s)} r^*(t) s(t, \alpha_z) dt \quad (8)$$

The conditional probability given by equation (7) has been derived assuming that the channel phase is approximately constant over the specified interval of time, i.e. $\theta(t) = \theta$, where $\theta$ is random and uniformly distributed, and that the transmitted signal is subject to additive Gaussian noise. It has been averaged over all possible values of the constant random phase $\theta$ of the received signal, and thus depends on only the modulus of the parameter $\beta_z$, reflecting the non-coherent character of the CPM detection. The parameter $\beta_z$ is a measure of correlation of the received signal r(t) and a candidate CPM waveform $s(t, \alpha_z)$ within the observation window; it can be estimated using a filter matched to said candidate CPM waveform $s_z$, and is therefore referred to hereinafter also as a matched filer (MF) output, or MF metric for a CPM waveform.

Computing the extrinsic information values using equation (6) requires examining all $M_c^{N_L}$ candidate CPM waveforms $s(t, \alpha_z)$ of length $N_L$, or all possible CPM phase functions $\psi(t, \alpha_z)$ corresponding thereto, and amounts to finding a most-likely CPM sequence. In a graphical representation, a time-domain phase diagram showing a plurality of all possible CPM phase functions $\psi(t, \alpha_z)$ for all possible candidate sequences $\alpha_z$, has a shape of a tree, which is shown by way of example in FIG. 5 for a binary CPM signal with $M_c=2$ and $\alpha=+\backslash-1$ for N=5. This tree is formed by a plurality of nodes, e.g. node 400, 500, 600 in FIG. 5, and branches, e.g. 401, 501, 601 and 602 in FIG. 5. The nodes represent all possible values of the CPM phase function at the ends $t_k$ of each symbol interval 410, 510, 610 etc, $t_k = t_m + k \cdot T_s$, k=0, . . . , N, $t_m$ being a time instance corresponding to the beginning of the current CPM decoding block, and each branch represents a possible CPM symbol phase function for one symbol interval, with $M_c$ branches originating at each node. An ML sequence of CPM symbols for the block corresponds to one path through the tree from the beginning to the end thereof, and can be found by searching through all other $M_c^{N_L}$ possible sequences, or possible paths in the tree.

The exhaustive search method for the ML sequence is optimal in terms of maximum likelihood decoding of the entire sequence, however, it is prohibitively complex particularly when the number of symbols N in a block, and the CPM alphabet size $M_c$ are large. This method can be greatly simplified by taking smaller blocksizes N over the hopping interval, e.g. such that $N \ll N_h$; this however leads to a reduced error correction performance. On the other hand, any increase in the blocksize results in an exponential increase in the detector complexity if the prior-art MSDD method is used.

The turbo-like decoder 300 of the receiver 200 of the present invention for decoding FH CPM signals differs from the prior-art CPM decoders in that it employs a method of iterative tree search to non-coherently decode the serially-concatenated CPM signal, wherein the extrinsic information, or bit probability values for the inner bits are determined by the inner CPM detector recursively, and wherein only a limited fraction of all possible CPM symbol sequences is examined and retained at each iteration, thereby enabling long sequence decoding.

The method of the present invention takes advantage of an observation that the LLR term in equation (6) is likely to be primarily determined by a relatively small fraction of all possible CPM waveforms $s_z$, namely those for which the MF metric $|b_z|$ is relatively large.

Using the graphical representation of the phase diagram, the problem of finding these "dominant" sequences becomes one of detecting the most probable paths through the tree. The method of this invention adopts a recursive approach to this task whereby at each node in the tree the path is extended according to a metric formed for each branch leading out of the node, where the metric for each branch is proportional to the probability of the received signal for that branch, so that the exhaustive search over all possible symbol sequences is reduced to searching over a limited number of dominant sequences, or tree paths. To facilitate the recursive path search, we apply the iterative tree search (ITS) detection technique wherein this selection of the "dominant", or "surviving" sequences is iteratively updated in subsequent iterations as described herein below.

The method of the present invention, which enables to efficiently decode long CPM sequences by examining only a relatively small number of M candidate CPM symbol sequences at each iteration, and using information provided by the outer decoder to iteratively improve the candidate sequence selection, will now be described in enough detail to enable one skilled in the art to practice the invention. The description will focus primarily on the functioning of the CPM decoder 220, which incorporates features of the present invention and, in combination with the outer decoder 240, provides a CPM decoder that is beneficially distinct from the prior art CPM decoders.

The inner CPM detector 220 processes the received down-converted signal r(t) in time portions, or blocks, also referred to as decoding blocks, which are time-synchronized to positions of CPM symbols in the received signal, said symbol positions also referred to as CPM symbol intervals, and consist of a sequence of N consequent CPM symbol intervals. The decoding blocks are selected so that each sequence of N CPM symbol intervals lies within a single hop interval $T_h$, and are preferably included in a single hop interval, so that $N \leq N_h$. In an exemplary embodiment described hereinafter, all CPM symbols within one hop interval are processed as one CPM decoding block, i.e. $N=N_h$. In other embodiments one hop interval may include several decoding blocks, i.e. $N_h=K \cdot N$, $K>1$.

The processing of each decoding block within the CPM decoder 220 is done recursively starting with a first CPM symbol interval from the sequence of N CPM symbol intervals of the decoding block, and adding consecutive symbol intervals one by one, or optionally in groups of symbol intervals, so to determine at each recursive step a sub-set of at most M "most-likely" CPM symbol sequences up to a current symbol interval using a selection criterion based on maximizing a path metric. The M "surviving" sequences of CPM symbols are used to compute the extrinsic information values for respective inner encoded bits using e.g. equation (6) or an approximation thereto. The number M will be referred to hereinafter as the candidate list size, and is preferably selected so that $M_c^{N_L} > M > 1$.

In a preferred embodiment of the method, a path metric $\gamma_{z,\eta}$ is defined for each considered sequence $\psi_{z,\eta}(\alpha_{z,\eta},t)$ of $\eta$ consecutive CPM symbols in relation to a section of the received signal r(t) of duration $\eta T_s$ within the decoding block, as follows:

$$\gamma_{z,\eta} = \log\left(I_0\left(\frac{2}{N_0}|\beta_{z,\eta}|\right)\right) + \Lambda_{z,\eta} \tag{9}$$

Here $\Lambda_{z,\eta}$ represents an a-priori log-probability for said sequence of $\eta$ CPM symbols, which is also referred to hereinafter as the cumulative a-priori metric; it can be obtained as described hereinbelow from the encoded output 245 of the outer decoder. The correlation parameter $$\beta_{z,\eta} = \int_{t_m}^{(t_m+\eta \cdot T_s)} r^*(t) s(t, \alpha_{z,\eta}) dt \tag{10}$$

defines the MF metric $\beta_{z,\eta}$ for the considered sequence of $\eta$ CPM symbols, also referred to hereinafter as the cumulative MF metric; it can be obtained as the output of the filters 222 by adapting their complex transfer functions to match the CPM waveform $s(t,\alpha_{z,\eta}) \sim \exp(\psi_{z,\eta}(\alpha_{z,\eta},t))$, as described hereinbelow. Here $\alpha_{z,\eta} = \{\alpha_{z,1-L}, \ldots, \alpha_{z,k}, \ldots, \alpha_{z,\eta-1}\}$ is a sequence of α-symbols that defines the CPM phase function $\psi_{z,\eta}(\alpha_{z,\eta},t)$ corresponding to the considered sequence of $\eta$ CPM symbols.

According to the method of present invention, the path metrics $\gamma_{z,\eta}$ is computed recursively using the following equations:

$$\beta_{z,\eta} = \lambda \beta_{z,\eta-1} + e^{-j\Phi_{z,\eta}} \Delta \beta_{z,\eta} \tag{11a}$$

$$\Delta \beta_{z,\eta} = \int_{t_m+(\eta-1) \cdot T_s}^{t_m+\eta \cdot T_s} r^*(t) s(t, \alpha_{z,\eta}) dt \tag{11b}$$

where $\Delta \beta_{z,\eta}$ is an MF metric increment corresponding to appending a particular CPM symbol to the z-th sequence of $\eta$ CPM symbols, $\lambda \leq 1$ is a positive "forgetting" factor. The parameter $\Delta \beta_{z,\eta}$ is also referred to hereinafter as the MF branch metrics, or simply as the branch metrics, in reference to the tree representation of the CPM phase diagram for one decoding block, wherein each possible CPM symbol for a $\eta$-th symbol interval of a z-th sequence of symbols is represented as a different branch of the respective tree structure.

The phase $$\Phi_{z,\eta} = \pi h \sum_{i=0}^{\eta-L} \alpha_{z,i}$$

in equation (11a) represents a phase accumulation of the z-th CPM waveform up to the $\eta^{th}$ symbol interval $\eta T_s \leq t \leq t_m+(\eta+1)T_s$, and will be referred to as the cumulative phase of the z-th CPM waveform; it can be calculated recursively if its value is known up to the $(\eta-1)$st symbol interval using the following phase update equation $$\Phi_{z,\eta} = \Phi_{z,\eta-1} + \Delta \Phi_{z,\eta} \tag{12a},$$

where the phase increment $\Delta \Phi_{z,\eta}$ is computed according to $$\Delta \Phi_{z,\eta} = \pi h \alpha_{z,\eta-L} \tag{12b}.$$

Similarly, the a-priori log-probability $\Lambda_{z,\eta}$ for the z-th CPM symbol sequence up to the η-th symbol interval, or the cumulative a-priori metric, can also be calculated recursively from a respective cumulqtive a-priori metria $\Lambda_{z,\eta-1}$ up to the (η−1)st symbol interval as $$\Lambda_{z,\eta} = \Lambda_{z,\eta-1} + \Delta\Lambda_{z,\eta} \qquad (13a)$$

wherein the η-th a-priori metric increment $\Delta\Lambda_{z,\eta}$ is substantially an a-priori log-probability for a particular CPM symbol to be at the η-th symbol interval of a z-th sequence of CPM symbols for the current decoding block; its value can be determined from the extrinsic information values $L_A(\tilde{b}_{\eta,l})$ for the encoded $\tilde{b}_{k,l}$, which are generated by the outer decoder 240 and the interleaver 270 as the encoded output 275. Assuming a bipolar mapping of the binary one-bit symbols $\tilde{b}_{k,l}$ at the output of the CPM decoder 220, so that logical "1" and "0" are presented as 1 and −1, respectively, and that the interleaved bits $\tilde{b}_{\eta,l}$ are independently distributed, the a-priori symbol-based log-probability $\Delta\Lambda_{z,\eta}$ can be computed using the following equation:

$$\Delta\Lambda_{z,\eta} = \frac{1}{2}\sum_{l} L_A(\tilde{b}_{\eta,l})\tilde{b}_{\eta,l} \qquad (13b)$$

where $\tilde{b}_{\eta,l}$ are the encoded bits mapped onto the symbol $\alpha_{z,\eta}$, l=0, ..., $M_c$−1. This operation represents converting the soft bit estimates $L_A(\tilde{b}_{\eta,l})$ into soft symbol estimates $\Delta\Lambda_{z,\eta}$.

The recursive process of selecting M "surviving" sequences of N CPM symbols for a decoding block, which in this embodiment coincides with a hop interval, can be implemented on the basis of formulas (11a)-(13b). FIG. 3 shows main functional blocks of the CPM detector 220 that can be used to implement this recursive CPM detecting in one embodiment of the invention.

In the following description, we first consider a η-th step of the recursive algorithm and assume that the first (η−1) out of N CPM symbol intervals of the baseband signal r(t) within the current hop interval have been already recursively processed, and M "surviving" sequences $s_{z,\eta-1}$ of CPM symbols for CPM symbol intervals leading up to a current, η-th CPM symbol interval have been identified, together with their corresponding sequences $\alpha_{z,\eta-1}$ of (η+L−1) α-symbols, z= 0, ..., M−1, $s_{z,\eta-1}$=s(t, $\alpha_{z,\eta-1}$).

In the η-th step of the recursive process, each of the M sequences of CPM symbols are propagated into the next, η-th symbol interval by appending one a symbol to each of the M sequence $\alpha_{z,\eta-1}$, z=0, ..., M−1. This in turn includes the following processing steps performed by the CPM decoder 220 shown in FIG. 3.

First, at the beginning of the η-th symbol interval the filters in the filter bank 222 are adapted to match all possible CPM symbol waveforms for this symbol interval; since CPM has memory, there may be M·$M_c$ such CPM symbol waveforms corresponding to appending every one of $M_c$ possible α-symbols $\alpha_l$ to each of the M sequences $\alpha_{z,\eta-1}$; the filter bank 222 thus includes M·$M_c$ filters, each of which is adapted to match one of the M·Mc symbol waveforms for the η-th symbol interval.

Figure 5:
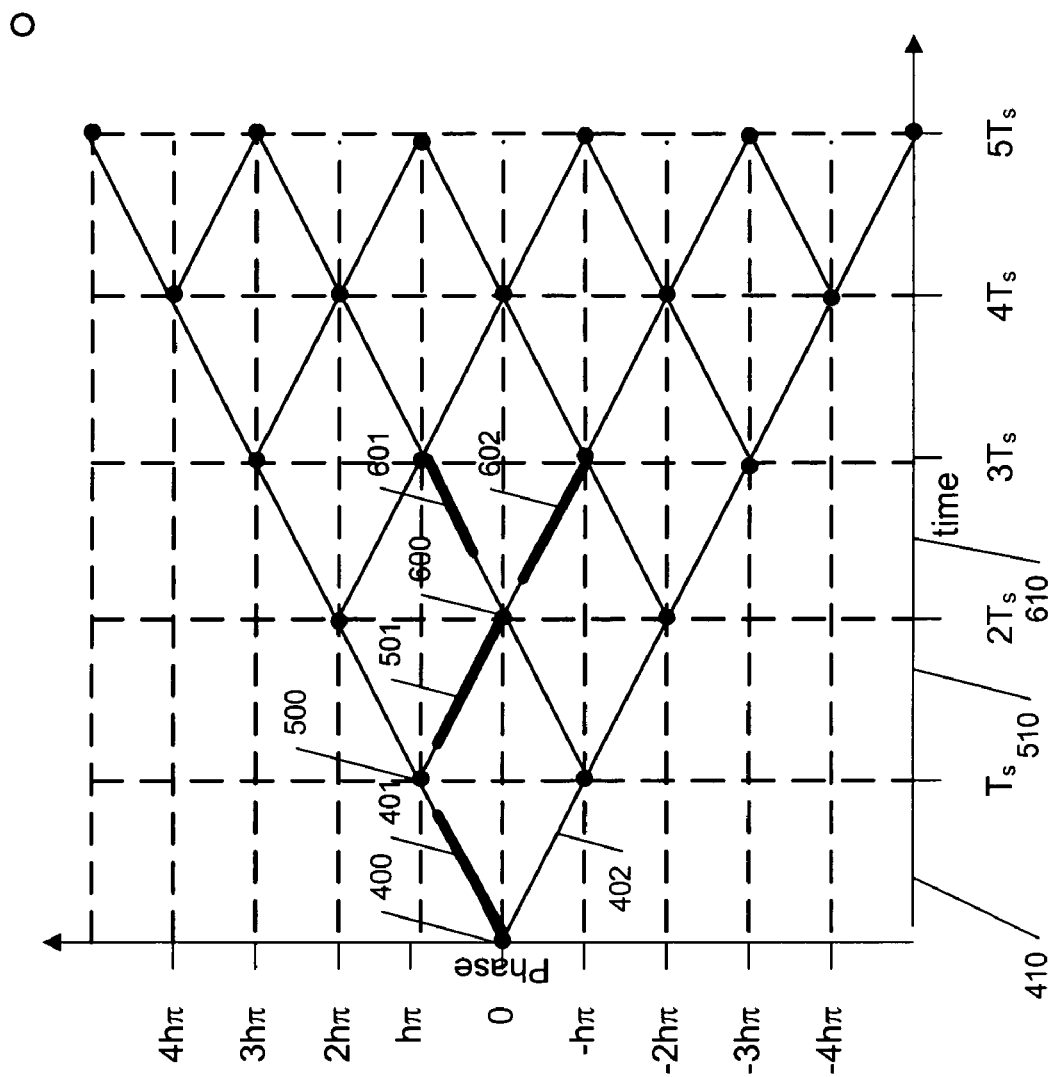
FIG. 5 is a graph illustrating the phase tree for a decoding block of five symbol intervals for a binary CPFSK.

Parallel outputs 303 of the M·$M_c$ filters during the η-th symbol interval provide M groups of $M_c$ branch metrics $\Delta b_{z,\eta}$ to a processing unit 310 for computing M·$M_c$ cumulative MF metrics $b_{z,\eta}$, each corresponding to a candidate sequence of η α-symbols $\alpha_{z,\eta-1,l}$={$\alpha_{z,\eta-1}$, $\alpha_l$} obtained from one of the M sequences $\alpha_{z,\eta-1}$ by appending one of $M_c$ possible α-symbols $\alpha_l$, l=0, ..., $M_c$−1, for the ηth symbol interval. This is illustrated by way of example in FIG. 5 showing by bold lines $M_c$=2 branches 601 and 602 which are appended to a surviving sequence 401,501 at a step η=3, to form two candidate paths {401,501,601} and {401,501,602}, corresponding to two candidate α-sequences {1,−1,1} and {1,−1,−1}. The M·$M_c$ cumulative MF metrics $\beta_{z,\eta}$ are computed in the processing unit 310 as described by equations (11a)-(12b) from M cumulative branch metrics $\beta_{z,\eta-1}$ and M cumulative phase $\Phi_{z,\eta-1}$ obtained by the CPM detector 220 at the previous (η−1) step.

The resulting M·$M_c$ cumulative MF metrics are passed onto a processing unit 301, which computes the path metric $\gamma_{z,\eta}$ for each of the M·$M_c$ candidate CPM symbol sequences s(t,$\alpha_{z,\eta-1,l}$) as described by equation (9) by combining these cumulative MF metrics $\beta_{z,\eta}$ with cumulative a-priori metrics $\Lambda_{z,\eta}$ for respective symbol sequences provided by the a-priori data processing unit 330. The a-priori data processing unit 330 recursively computes the cumulative a-priori metrics $\Lambda_{z,\eta}$ from its value at the previous step and the a-priori branch metrics $\Delta\Lambda_{z,\eta}$ for the ηth symbol interval, which in turn is computed by the a-priori data processing unit 330, e.g. as described by equation (13b), from the a-priori information values $L_A(\tilde{b}_{\eta,l})$ for the inner bits received from the outer decoder 240 via the interleaver 270.

The path metrics $\gamma_{z,\eta}$ for the M·$M_c$ candidate sequences are then passed onto a selector unit 340, which selects M surviving sequences s(t,$\alpha_{z,\eta}$) of η CPM symbols having the largest path metrics from the M·$M_c$ candidate sequences s(t,$\alpha_{z,\eta-1,l}$), l=0, ..., $M_c$−1, z=0, ..., M−1, and provides information about the surviving sequences to the MF block 222, and cumulative metrics processing units 310 and 320 for use in the following processing step for processing the next, (η+1)st CPM symbol interval of the current decoding block.

In some embodiments of the invention, information about the M surviving sequences s(t,$\alpha_{z,\eta}$) including their path metrics $\gamma_{z,\eta}$ is passed onto an LLR processing block 350, which then computes soft-level inner extrinsic information values $L_E(\tilde{b}_{k,l})$, l=0, ..., $m_b$, for $m_b$ inner bits $\tilde{b}_{k,l}$ corresponding to a k-th symbol interval, k≤η, using the identified M surviving sequences of η CPM symbols and their path metrics $\gamma_{z,\eta}$. In one embodiment, computation of the extrinsic values $L_E(\tilde{b}_{k,l})$ can be done on the basis of equations (6) and (7), by substituting N=η, and by noting that the path metrics $\gamma_{z,\eta}$ logarithmically correspond to respective terms in square brackets in the nominator and denominator of the first term of the RHS of equation (6).

In another embodiment, the LLR computation can be simplified by using the following approximate equation for the bit-level inner extrinsic value $L_E(\tilde{b}_{k,l})$ for the $l^{th}$ inner bit:

$$L_E(\tilde{b}_{k,l}) = \frac{\sum_{z:\tilde{b}_{k,l}=1} \gamma_{z,\eta}}{\sum_{z:\tilde{b}_{k,l}=0} \gamma_{z,\eta}} - L_A(\tilde{b}_{k,l}), \qquad (14)$$

where the summation in the numerator of the first term of the RHS of equation (14) is done over all surviving sequences that have a logical "1" in the l-th bit position of the k-th symbol interval, and the summation in the denominator of the first term of the RHS of equation (14) is done over all surviving sequences that have a logical "0" in the l-th bit position of the k-th symbol interval. If all M surviving sequences correspond to the same logical value of the $\tilde{b}_{k,l}$ bit, i.e. either "1" or "0", the corresponding soft extrinsic information is $L_E(\tilde{b}_{k,l})$ assigned a pre-determined "clipping" value, e.g. +3 or −3, respectively, assuming the bipolar mapping of the inner bits $\tilde{b}_{k,l}$.

In another embodiment, computing of the extrinsics $L_E$ ($\tilde{b}_{k,l}$) can be further simplified by using so-called Max-log-APP approximation. Max-log-APP is a form of MAP processing where some or all calculations of expressions of the form $\log_b (b^x+b^y)$ are approximated as $\max(x,y)$. The letter "b" is used to denote the base of the logarithm, which is arbitrary. The letters "x" and "y" represent the quantities being "combined", which are typically log-probability quantities having the same base "b". Using this approximation, the path metrics are computed simply as a weighted sum of respective cumulative MF and a-priori metrics:

$$\gamma_{z,\eta} = \frac{2}{N_0}|\beta_{z,\eta}| + \Lambda_{z,\eta}, \qquad (15)$$

The soft extrinsic information values for the inner bits $L_E$ ($\tilde{b}_{k,l}$) are computed in this embodiment by first identifying a) a maximum path metrics max $$\max_{z: \tilde{b}_{k,l}=1}[\gamma_{z,\eta}]$$

for those of the M surviving sequences that have logical "1" in the l-th bit position of the k-th symbol interval, b) a maximum path metrics max $$\max_{z: \tilde{b}_{k,l}=0}[\gamma_{z,\eta}]$$

for those of the M surviving sequences that have a logical "0" in the l-th bit position of the k-th symbol interval, and then computing the extrinsic information $L_E(\tilde{b}_{k,l})$ by simply subtracting from the first path metrics the second and the a-priori information for the respective bit:

$$L_E(\tilde{b}_{k,l}) = \left[\max_{z: \tilde{b}_{k,l}=1}[\gamma_{z,\eta}] - \max_{z: \tilde{b}_{k,l}=0}[\gamma_{z,\eta}]\right] - L_A(\tilde{b}_{k,l}) \qquad (16)$$

Although the Max-log-APP approximation generally results in a degradation of decoding quality, computing the soft output 225 of the decoder on the basis of equation (16) can provide a significant reduction in computational complexity of the method and of the LLR processing unit 350, and thereby improve speed of CPM processing; furthermore, the resulting errors can often be at least partially corrected in the following iterations of the iterative decoder 300, and may not lead to a significant increase in the overall bit error rate (BER) of the receiver 200.

Once the η-th symbol interval is processed, the CPM decoder repeats the aforedescribed decoding steps for the (η+1)st CPM symbol interval, starting with adapting the M·$M_c$ filters of the filter bank 222 to match M·$M_c$ possible CPM symbol waveforms given the previously identified M surviving CPM waveforms s(t,$\alpha_{z,\eta}$), and outputting at the end of the (η+1)st processing step $m_b$ extrinsic information values $L_E(\tilde{b}_{k+1,l})$, l=0, ... , $m_b$−1, for the (k+1)st symbol interval, until all N symbol intervals of the current decoding block are processed, and the CPM decoder provided N·$m_b$ extrinsic information values $L_E(\tilde{b}_{k+1,l})$ for the inner bits as its output 225.

The selection of the k-th symbol interval for which the extrinsic values are computed in each of the recursive steps is somewhat flexible. Generally, it is preferable to estimate the extrinsic values using the received signal in both past and future symbol intervals. By way of example, a constant number of B "future" symbols is used for most of the recursive steps, i.e. k=η−B, except for the first and last B symbol intervals of each processing block, for, which the extrinsic information values can be computed e.g. using appropriately truncated surviving sequences, as would be clear to those skilled in the art. A trade-off when including B future symbols in the soft estimate $L_E(\tilde{b}_{k,l})$ for the $l^{th}$ bit of the $k^{th}$ symbol is that a correct path through the tree for detection of the $k^{th}$ symbol may have been discarded at the $(k+B)^{th}$ symbol interval. When this scenario occurs, the candidate list size M can be increased.

In the embodiments described hereinabove, the extrinsic information values $L_E(\tilde{b}_{k,l})$ have been computed in each of the recursive steps on the bases of recursively defined portions of one hop interval, i.e. of one decoding block of N CPM symbol intervals. In another embodiment, all of the extrinsic information values for one decoding block can be computed in one step on the basis of the M surviving sequences of N CPM symbols for the whole hop interval, after said M surviving sequences have been recursively determined as described hereinabove.

The aforedescribed recursive process of identifying a subset of M surviving CPM symbol sequences for one hop (decoding) interval can be initialized at the beginning of each said interval by using pre-determined initial values for the cumulative MF metric $\beta_{z,\eta}$, phase $\Phi_{z,\eta}$, and a-priori log-probabilities $\Lambda_{z,\eta}$; in one embodiment, the initial values of these parameters $\beta_{z,0}$, phase $\Phi_{z,0}$, and a-priori log-probabilities $\Lambda_{z,0}$ are all set to zero, so that e.g. $\beta_{z,\eta}=\Delta\beta_{z,\eta}$ for η=1.

Since the decoding is non-coherent and a constant phase offset within each hop interval is irrelevant, the filter bank 222 may not require any special initializing for full-response CPM; for such signals the recursive processing starts with adapting $M_c$ filters of the filter bank 222 to match $M_c$ different CPM symbol waveforms s(t, $\alpha_l$)=$e^{j2\pi h\alpha_l q(t-iT_s)}$ for the first CPM symbol interval in the decoding block, in this case—hop interval, where l spans from 0 to ($M_c$−1), said $M_c$ different CPM symbol waveforms corresponding to $M_c$ possible $\alpha_l$ symbol values. If $M_c$<M, all of the $M_c$ possible waveforms are kept after processing the first symbol interval, yielding $M_c^2$ candidate sequences, from which at most M surviving sequences are to be selected in the second recursive step corresponding to η=2, if $M_c^2$>M.

However, for a partial response CPM with memory L>1, the shape of each of the CPM symbol waveforms for the first symbol interval, η=1, depends on (L−1) preceding α symbols, and therefore there can be $M_c^L$ different CPM waveforms corresponding to all possible sequences of L α-symbols. In one embodiment, the number of filters used in the first step of the recursive process, η=1, is kept at $M_c$ by using same pre-determined values for the first (L−1) α-symbols in each of the $M_c$ sequences $\alpha_{z,\eta}$, which could be either block-independent, or taken as the last (L−1) decoded α-symbols in the preceding decoding block (hop interval). In another embodiment, all $M_c^L$ symbol waveforms can be used to initialize $M_c^L$ candidate sequences $s_z$ in the first step.

By way of example, during the first CPM symbol interval, the $M_c$ filters are matched to $M_c$ different CPM symbol waveforms $s_{z,\eta=1}$ corresponding to $M_c$ sequences $\alpha_{z,\eta=1}$, $z=0, \ldots,$ (Mc−1) of length L, wherein the first (L−1) α-symbols each correspond to an all-zero bit sequence of length $m_b$.

The recursive SISO CPM decoding process described hereinabove with reference to FIG. 3 results in a sequence of $N \cdot m_b$ extrinsic information values $L_E(\text{б}_{k,l})$ for the inner bits б; this soft inner bit sequence forms the output 225 of the CPM decoder 220 in one iteration of the turbo-like decoder 300; in the following we will denote these soft inner bits as $L_E^i(\text{б}_{k,l})$, where the superscript i refers to an i-th decoding iteration of the turbo-decoder 300.

The following processing depends on a relation between the interleaver length I and the number of bits $N \cdot m_b$ in the decoding block. In embodiments wherein the decoding block includes one or more interleaver blocks, i.e. $N=K \cdot I$, $K \geq 1$, the inverse interleaver 230 de-interleaves the $N \cdot m_b$ soft inner bits $L_E^i(\text{б}_{k,l})$ of the current CPM decoding block, and provides the resulting encoded plurality of outer bit-level extrinsic information values 235, which can also be referred to as soft outer bits 235, to the outer decoder 240, which in response generates $N \cdot m_b$ 'improved' soft values for the encoded outer bits and passes them to the interleaver 270, which outputs the respective a-priori inner information values $L_A^i(\text{б}_{k,l})$, thereby completing the i-th iteration. The CPM detector 220 then uses the a-priori inner information values $L_A^i(\text{б}_{k,l})$ obtained in the i-th iteration in the $(i+1)^{st}$ iteration of the recursive processing of the same CPM decoding block corresponding to the same received down-converted signal r(t) that was processed in the i-th iteration, in order to update the sub-set of M "surviving" sequences of N $M_c$-ary symbols and the plurality of $N_b$ bit-level inner encoded extrinsic information values $L_E^i(\text{б}_{k,l})$ to generate updated bit-level inner extrinsic values $L_E^{i+1}(\text{б}_{k,l})$.

Note that during the first iteration, i=1, when the a-priori bit information values $L_A^i(\text{б}_{k+1,l})$ are not yet available, the a-priori parameters $L_A(\text{б}_{k+1,l})$ and $\Lambda_{z,\eta}$ in equations (9), (13a)-(16) could be initialized with pre-defined values, e.g. set to zero.

Subsequent iterations correct erroneous paths decisions, i.e. non-optimal selection of surviving symbol sequences, made at previous iterations by the CPM detector 220, which are influenced to an increasingly greater degree by the a priori information provided by the outer MAP decoder 240, thereby progressively improving the output accuracy of the recursive CPM detector 220.

In another embodiment it can be preferred that the interleaver length I exceeds the decoding block length N; for example, for a frequency hopping implementation, it can be preferred that the interleaver length includes several hop intervals, i.e. $I=K \cdot (N_h \cdot m_b)$, $K>1$. In such embodiments it can still be convenient to select decoding blocks to coincide with the hop intervals, i.e. $N=N_h$. In this case, the CPM detector 220 processes K decoding blocks, or K hop intervals in one iteration, and outputs a sequence of I extrinsic values $L_A^i(\text{б}_{k+1,l})$ that are buffered and then de-interleaved by the inverse interleaver 230, with the rest of the processing continuing as described above. Therefore, in this case the iterative decoder 300 as a whole operates on signal blocks of size $I=K \cdot (N_h \cdot m_b)$, which exceeds the size of the decoding block $N_h$ of the inner CPM decoder 220.

Simulation Results

Figure 4:
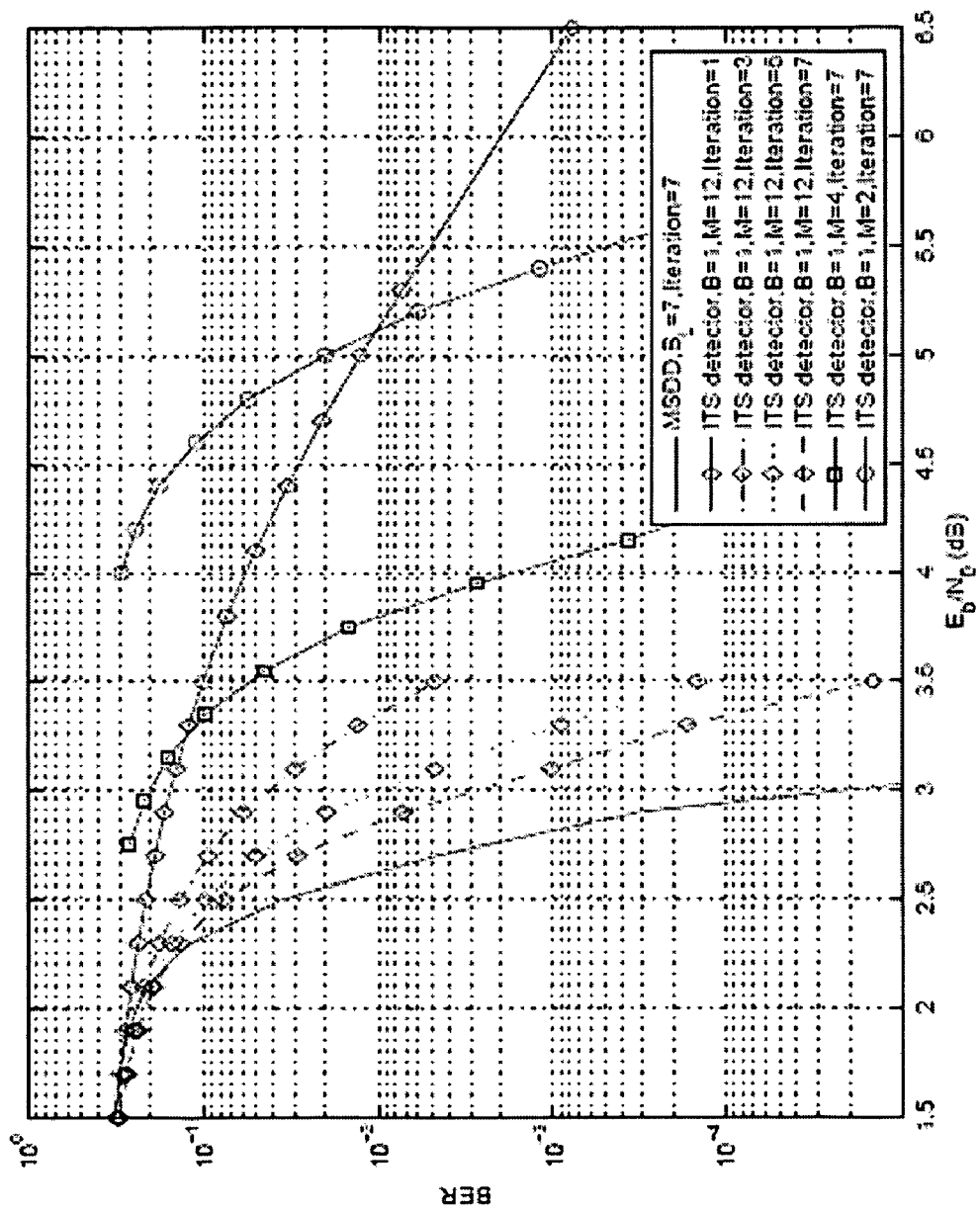
FIG. 4 is a graph showing the BER performance of the CPM decoder of the present invention in comparison to the conventional block CPM decoder.

FIG. 4 shows the bit error rate (BER) performance of the recursive CPM decoder of the present invention for a rate ½ convolutional outer code, labeled "ITS detector", compared to a scheme implementing the prior-art MSDD method over a blocklength of seven symbols, BL=7. It is clear from this Figure that upon successive iterations the ITS detector with list size M=12 and B=1 can correct erroneous path decisions, resulting in a BER performance after 7 iterations that is within 0.5 dB of the MSDD method at an error rate of $10^{-3}$. In terms of complexity, the MSDD technique must search $2^{BL}=128$ candidate sequences for each symbol processed, whereas the CPM detector of the present invention retains only M=12 sequences at each node through the tree for a marginal loss in BER performance. FIG. 4 also shows the flexibility of the iterative CPM detector of the present invention when trading performance for complexity. As the candidate list size is reduced to M=4 and M=2 respectively, the performance of the receiver is also reduced such that the loss in performance compared to the MSDD scheme is approximately 1.2 dB and 2.6 dB respectively at an error rate of $10^{-3}$. Therefore, for a given receiver complexity budget, the CPM detector of the present invention can be employed to yield the best error rate performance based on the receiver architecture.

The preceding description has been directed towards a communication system with frequency hopping. However, the method and apparatus of the present invention can be equally applied for iterative decoding of serially concatenated encoded CPM signals without frequency hopping, with only minor modifications that would be apparent to those skilled in the art.

The present invention has been fully described in conjunction with the exemplary embodiments thereof with reference to the accompanying drawings. Of course numerous other embodiments may be envisioned without departing from the spirit and scope of the invention; it is to be understood that the various changes and modifications to the aforedescribed embodiments may be apparent to those skilled in the art. Such changes and modifications are to be understood as included within the scope of the present invention as defined by the appended claims, unless they depart therefrom.

We claim:

1. In a communication system comprising a transmitter and a receiver, wherein the transmitter comprises an outer encoder followed by a transmitter interleaver and an $M_c$-ary continuous phase modulation (CPM) modulator for transmitting a CPM signal modulated with a sequence of $M_c$-ary symbols, a method for non-coherent decoding of the CPM signal received by the receiver via a communication channel, the method comprising:

a) identifying CPM symbol positions in the received CPM signal;

b) selecting a portion of the received CPM signal comprising N consecutive CPM symbol positions;

c) generating a sequence of $N_b = N*\log_2(M_c)$ inner extrinsic information values for the selected portion of the received CPM signal from $N_b$ a-priori information values and a plurality of complex branch metrics using a recursive tree search algorithm, wherein at each step of said algorithm at most M tree paths are retained, $1 < M < M_c^N$, wherein each tree path corresponds to a sequence of up to N $M_c$-ary symbols, and wherein the tree paths to be retained are selected based on absolute values of cumulative metrics associated therewith and accounting for the a-priori information values, and wherein the cumulative metrics are complex-valued and are recursively obtained from the complex branch metrics;

d) providing the sequence of $N_b$ inner extrinsic information values to an inverse interleaver to form a de-interleaved sequence of inner information values, and sending said de-interleaved sequence to an outer SISO decoder;

e) generating a sequence of $N_b$ encoded outer extrinsic information values using the outer SISO decoder from said de-interleaved sequence;

f) interleaving the sequence of $N_b$ encoded outer extrinsic information values to generate the set of $N_b$ a-priori information values, and providing said set of $N_b$ a-priori information values to the inner CPM decoder;

g) iteratively repeating the sequence of steps (c)-(f); and, h) generating a decoded sequence of $N_b$ soft outer extrinsic values obtained by the outer SISO decoder from the $N_b$ de-interleaved inner extrinsic information values.

2. The method of claim 1, wherein the outer decoder is a convolutional decoder.

3. The method of claim 1, wherein the outer decoder is a block decoder.

4. The method of claim 1, wherein the transmitted CPM signal has a hopping carrier frequency.

5. The method of claim 4, wherein N is a number of Mc-ary symbols transmitted during a time interval between consecutive hops of the hopping carrier frequency.

6. The method of claim 4, wherein N is equal to a number $N_h$ of Mc-ary symbols between consecutive frequency hops, and wherein the interleaver size I is at least equal to $K \cdot N_b$, wherein K is an integer greater than 1.

7. The method of claim 6, wherein c) includes buffering of K consecutive sequences of $N_b$ inner extrinsic information values prior to the de-interleaving.

8. The method of claim 1, wherein the transmitter interleaver is pseudo-random.

9. The method of claim 1, wherein c) comprises:

I) identifying M surviving sequences of CPM symbols for symbol positions leading to a current symbol position;

II) obtaining $M_c$ complex branch metrics for the current symbol position for each of the M surviving sequences of CPM symbols using matched filters that are matched to possible CPM symbol waveforms for said symbol position;

III) computing $M \cdot M_c$ path metrics for $M \cdot M_c$ candidate sequences of CPM symbols corresponding to all possible extensions of the M surviving sequences of CPM symbols into the current symbol position by i) combining previously determined cumulative metrics for each of the M surviving sequences of CPM symbols leading to the current symbol position and the respective $M_c$ complex branch metrics for the current symbol position to compute $M \cdot M_c$ cumulative metrics for the $M \cdot M_c$ candidate sequences of CPM symbols, and ii) combining absolute values of the $M \cdot M_c$ cumulative metrics and the a-priori information for the current symbol position;

IV) selecting M surviving sequences of CPM symbols with largest path metrics from the $M \cdot M_c$ candidate sequences of CPM symbols up to and including the current symbol position;

V) computing $\log_2(M_c)$ inner extrinsic information values for a selected symbol position by computing bit-level log-likelihood ratios on the basis of path metrics for M surviving sequences of CPM symbols, and on the basis of the a-priori information values for the selected symbol position obtained from the outer decoder; and, VI) recursively repeating (II)-(V) to determine inner extrinsic information values for symbol intervals following the selected symbol interval.

10. The method of claim 9, wherein (V) comprises computing the log-likelihood ratio using a max-log approximation.

11. The method of claim 9, wherein the CPM is a partial-response CPM with a memory L>1, so that a CPM symbol waveform depends on (L−1) preceding CPM symbols.

12. The method of claim 9, wherein the CPM is a full-response CPM.

13. The method of claim 1, further including generating a decoded sequence of $N_b$ binary symbols by making hard decisions on the decoded sequence of outer extrinsic values.

14. A non-coherent receiver for receiving and decoding a CPM signal R(t) received by a wireless receiver via a communication channel, the CPM signal generated by encoding an input binary bit sequence with an outer encoder to obtain an encoded binary bit sequence, interleaving the encoded binary bit sequence with a transmitter interleaver to obtain an interleaved binary bit sequence, mapping the interleaved binary bit sequence to a sequence of $M_c$-ary symbols, modulating an RF carrier signal using a $M_c$-ary CPM modulator to form an RF CPM signal, and transmitting thereof via the wireless communication channel, the non-coherent receiver comprising:

a frequency down-converter for down-converting the received CPM signal R(t) to obtain a down-converted signal including N consecutive CPM symbol intervals;

a non-coherent CPM detector, comprising:

a bank of CPM waveform matched filters for obtaining $M_c$ complex branch metrics for each of the N consecutive CPM symbol intervals by filtering the down-converted signal in the respective symbol intervals;

an inner recursive CPM SISO processor coupled to the CPM waveform matched filters for receiving the complex branch metrics and $N_b$ a-priori information values, and for recursively forming therefrom a sequence of $N_b = N * \log_2(M_c)$ inner extrinsic information values for the N consecutive CPM symbol intervals;

a de-interleaver for de-interleaving the sequence of $N_b$ inner extrinsic information values and for providing a sequence of $N_b$ de-interleaved soft information values;

an outer SISO decoder for generating soft encoded outer extrinsic information values and soft decoded outer extrinsic information values; and, a feedback link from the outer decoder to the inner recursive CPM SISO decoder for providing the encoded outer extrinsic information values thereto as the a-priori information values, the feedback link including an interleaver;

wherein the inner recursive CPM SISO processor generates the sequence of $N_b$ inner extrinsic information values on the basis of the complex branch metrics and the $N_b$ a-priori information values obtained from the outer SISO decoder using a recursive tree search algorithm wherein at most M tree paths having largest path metrics among all examined tree paths are retained at each step, $1<M<M_c^N$, each tree path corresponding to a different sequence of $M_c$-ary CPM symbols for the N consecutive CPM symbol intervals.

15. A non-coherent receiver according to claim 14, wherein the outer decoder is a convolutional decoder.

16. A non-coherent receiver according to claim 14, wherein the transmitted CPM signal has a hopping RF carrier frequency.

17. A non-coherent receiver according to claim 15, wherein N is equal to a number $N_h$ of CPM symbols between consecutive frequency hops, and wherein the interleaver size I is at least equal to $K \cdot N_b$, wherein K is an integer equal or greater than 1.

18. A non-coherent receiver according to claim 14, wherein the interleaver is pseudo-random.

19. In a receiver for receiving a serially encoded signal modulated with $M_c$-ary symbols using a continuous phase modulation (CPM) format and transmitted via a communication channel corrupting the encoded signal, wherein said serially encoded signal is generated using an outer encoder, an interleaver and an $M_c$-ary CPM modulator operatively connected in series, a method for non-coherent decoding of the serially encoded signal comprising:

a) selecting a portion of the serially encoded signal modulated with a sequence of N consecutive $M_c$-ary symbols to form a decoding signal block;

b) selecting a sub-set of sequences of N $M_c$-ary symbols that maximize a path metric for the decoding signal block among all examined sequences of N $M_c$-ary symbols, wherein the path metric comprises an absolute value of a complex-valued cumulative metric for a corresponding sequences of $M_c$-ary symbols;

c) generating a plurality of bit-level inner encoded extrinsic information values for the decoding signal block on the basis of the selected sub-set of sequences of N $M_c$-ary symbols using corresponding path metrics;

d) processing the plurality of bit-level inner extrinsic information values with an outer decoder to obtain an encoded plurality of outer bit-level extrinsic information values and a decoded plurality of outer bit-level extrinsic information values;

e) updating the selected sub-set of sequences of N $M_c$-ary symbols using the plurality of outer bit-level extrinsic information values to update the path metrics;

f) outputting the decoded plurality of outer bit-level extrinsic information values after repeating (c) and (d).

20. A method for non-coherent decoding according to claim 19, wherein (b) and (e) are performed using recursive processing of progressively longer sequences of $M_c$-ary symbols.

21. A method for non-coherent decoding according to claim 20, wherein the sub-set of all sequences of N $M_c$-ary symbols includes at least two and at most M sequences of N $M_c$-ary symbols, where $1<M<M_c^N$.

* * * * *